United States Patent
Tokuda et al.

(10) Patent No.: US 10,804,362 B2
(45) Date of Patent: Oct. 13, 2020

(54) CRYSTALLINE OXIDE SEMICONDUCTOR FILM, CRYSTALLINE OXIDE SEMICONDUCTOR DEVICE, AND CRYSTALLINE OXIDE SEMICONDUCTOR SYSTEM

(71) Applicant: FLOSFIA INC., Kyoto (JP)

(72) Inventors: Rie Tokuda, Kyoto (JP); Masaya Oda, Kyoto (JP); Toshimi Hitora, Kyoto (JP)

(73) Assignee: FLOSFIA INC., Kyoto (JP)

(*) Notice: Subject to any disclaimer, the term of this patent is extended or adjusted under 35 U.S.C. 154(b) by 0 days.

(21) Appl. No.: 15/689,547

(22) Filed: Aug. 29, 2017

(65) Prior Publication Data

US 2018/0061952 A1 Mar. 1, 2018

(30) Foreign Application Priority Data

Aug. 31, 2016 (JP) .................... 2016-170409
Nov. 7, 2016 (JP) .................... 2016-217660
Jul. 13, 2017 (JP) .................... 2017-137446

(51) Int. Cl.
*H01L 29/24* (2006.01)
*H01L 21/02* (2006.01)
(Continued)

(52) U.S. Cl.
CPC .......... *H01L 29/24* (2013.01); *H01L 21/0242* (2013.01); *H01L 21/02414* (2013.01); *H01L 21/02433* (2013.01); *H01L 21/02483* (2013.01); *H01L 21/02565* (2013.01); *H01L 21/02576* (2013.01); *H01L 21/02609* (2013.01); *H01L 21/02628* (2013.01); *H01L 21/02631* (2013.01); *H01L 29/045* (2013.01);
(Continued)

(58) Field of Classification Search
CPC ...................................................... H01L 29/24
See application file for complete search history.

(56) References Cited

U.S. PATENT DOCUMENTS

2014/0217470 A1* 8/2014 Sasaki ................. H01L 29/7869
257/192
2015/0325659 A1 11/2015 Hitora et al.
(Continued)

FOREIGN PATENT DOCUMENTS

EP          3 190 608      7/2017
JP          2013-028480    2/2013
(Continued)

OTHER PUBLICATIONS

C.A. Hoel et al., "Pulsed-laser deposition of heteroepitaxial corundum-type ZITO: cor-In2-2xZnxSnxO3," Thin Solid Films 520 (2012) 2938-2942. (Year: 2012).*
(Continued)

*Primary Examiner* — Cuong Q Nguyen
*Assistant Examiner* — Peter M Albrecht
(74) *Attorney, Agent, or Firm* — Wenderoth, Lind & Ponack, L.L.P.

(57) ABSTRACT

In a first aspect of a present inventive subject matter, a crystalline oxide semiconductor film includes a crystalline oxide semiconductor that contains a corundum structure as a major component, a dopant, and an electron mobility that is 30 $cm^2/Vs$ or more.

20 Claims, 7 Drawing Sheets

(51) Int. Cl.

| | |
|---|---|
| H01L 29/808 | (2006.01) |
| H01L 33/42 | (2010.01) |
| H01L 29/66 | (2006.01) |
| H01L 29/778 | (2006.01) |
| H01L 29/739 | (2006.01) |
| H01L 29/78 | (2006.01) |
| H01L 29/04 | (2006.01) |
| H01L 29/872 | (2006.01) |
| H01L 33/32 | (2010.01) |

(52) U.S. Cl.
CPC .... *H01L 29/66969* (2013.01); *H01L 29/7395* (2013.01); *H01L 29/7787* (2013.01); *H01L 29/7813* (2013.01); *H01L 29/7828* (2013.01); *H01L 29/8083* (2013.01); *H01L 29/872* (2013.01); *H01L 33/42* (2013.01); *H01L 29/7802* (2013.01); *H01L 33/32* (2013.01)

(56) References Cited

U.S. PATENT DOCUMENTS

| | | | |
|---|---|---|---|
| 2015/0325660 A1* | 11/2015 | Hitora | H01L 29/7722 257/43 |
| 2017/0278706 A1 | 9/2017 | Oda et al. | |
| 2019/0058043 A1* | 2/2019 | Dewey | H01L 29/42364 |

FOREIGN PATENT DOCUMENTS

| | | |
|---|---|---|
| JP | 2015-228495 | 12/2015 |
| WO | 2016/035696 | 3/2016 |

OTHER PUBLICATIONS

G.T. Dang et al., "Mist-CVD Grown Sn-Doped alpha-Ga2O3 MESFETs," IEEE Transactions on Electron Devices, vol. 62, No. 11, Nov. 2015. (Year: 2015).*

I.A. Rauf, "Low resistivity and high mobility tin-doped indium oxide films," Materials Letters 18 (1993) 123-127. (Year: 1993).*

C.-T. Lee et al., "Investigation of Ga Oxide Films Directly Grown on n-Type GaN by Photoelectrochemical Oxidation Using He—Cd Laser," Journal of Electronic Materials, vol. 34, No. 3, 2005, pp. 282-286. (Year: 2005).*

K. Kaneko et al., "Growth and metal-oxide-semiconductor field-effect transistors of corundum-structured alpha indium oxide semiconductors," Applied Physics Express 8, 095503 (2015). (Year: 2015).*

D.Y. Guo et al., "Epitaxial growth and solar-blind photoelectric properties of corundum-structured alpha-Ga2O3 thin films," Materials Letters 164 (2016) 364-367, available online Nov. 2, 2015. (Year: 2015).*

M. Oda et al., "Schottky barrier diodes of corundum-structured gallium oxide showing on-resistance of 0.1 mOhm-cm2 grown by MIST EPITAXY," Applied Physics Express 9, 021101 (2016). (Year: 2016).*

K. Akaiwa et al., "Conductivity control of Sn-doped alpha-Ga2O3 thin films grown on sapphire substrate," Japanese Journal of Applied Physics 55, 1202BA (2016). Published online Nov. 9, 2016. (Year: 2016).*

X. Zhao et al., "Impurity Compensation Effect Induced by Tin Valence Change in alpha-Ga1.4Sn0.6O3 Thin Films," ACS Applied Materials & Interfaces 2017, 9, 983-988. Published Dec. 12, 2016. (Year: 2016).*

Extended European Search Report dated Jan. 26, 2018 in corresponding European Patent Application No. 17188724.3.

"Fabrication and Physical Properties of Corundum-Structured Alloys Based on Gallium Oxide" Doctor thesis of Kentaro Kaneko, Kyoto University, pp. 1-116, Mar. 2013 with English abstract.

"Conductivity Control and Device Applications of Corundum-Structured Gallium Oxide-Based Semiconductor" Doctor thesis of Kazuaki Akaiwa, Kyoto University, pp. 1-81, Mar. 2016 with English abstract.

Rustum Roy et al., "Polymorphism of $Ga_2O_3$ and the System $Ga_2O_3$—$H_2O$", Contribution from School of Mineral Industries, The Pennsylvania State College, Feb. 5, 1952, pp. 719-722.

Sam-Dong Lee et al., "Thermal Stability of Single Crystalline Alpha Gallium Oxide Films on Sapphire Substrates", Phys. Status Solidi, C, 10, No. 11, pp. 1592-1595 (2013) / DOI 10.1002/pssc. 201300259.

Kohei Sasaki et al., "Si-Ion Implantation Doping in $\beta$-$Ga_2O_3$ and its Application to Fabrication of Low-Resistance Ohmic Contacts", Applied Physics Express 6, (2013), 086502, pp. 086502-1-086502-4.

* cited by examiner

CRYSTALLINE OXIDE SEMICONDUCTOR FILM, CRYSTALLINE OXIDE SEMICONDUCTOR DEVICE, AND CRYSTALLINE OXIDE SEMICONDUCTOR SYSTEM

CROSS-REFERENCE TO RELATED APPLICATION

This application is a new U.S. patent application that claims priority benefit of Japanese patent applications No. 2016-170409 filed on Aug. 31, 2016, No. 2016-217660 filed on Nov. 7, 2016, and No. 2017-137446 filed on Jul. 13, 2017, the disclosures of which are incorporated herein by reference in its entirety.

BACKGROUND OF THE INVENTION

Field of the Invention

The present disclosure relates to a crystalline oxide semiconductor film. Also, the present disclosure relates to a crystalline oxide semiconductor device including the crystalline oxide semiconductor film. Furthermore, the present disclosure relates to a crystalline oxide semiconductor system including the crystalline oxide semiconductor device.

Description of the Related Art

It is open to the public that an Sn doped $\alpha$-$Ga_2O_3$ film formed on a c-plane of a sapphire substrate. The Sn doped $\alpha$-$Ga_2O_3$ film has a half value width that is about 60 arcsec, which shows a high crystallinity of $\alpha$-$Ga_2O_3$ film that is electrically conductive (For reference, see Japanese Unexamined Patent Application Publication No. 2013-028480). However, it is still insufficient about maintaining pressure resistance, for example. Furthermore, the Sn doped $\alpha$-$Ga_2O_3$ film has an electron mobility that is 1 $cm^2$/Vs or less, and this is still insufficient to be used for a semiconductor film.

Also, it is open to the public that an Ge doped $\alpha$-$Ga_2O_3$ film formed on a c-plane of sapphire substrate (For reference, see Japanese Unexamined Patent Application Publication No. 2015-228495), which is better in electrical characteristics than the Sn doped $\alpha$-$Ga_2O_3$ film mentioned above. However, the Ge doped $\alpha$-$Ga_2O_3$ film has an electron mobility 3.26 $cm^2$/Vs, which is still insufficient for a semiconductor film.

Furthermore, fabrication of corundum-structured alloys based on gallium oxide and physical properties of the corundum-structured alloys are open to the public (See Non-patent document, "Fabrication and physical properties of corundum-structured alloys based on gallium oxide" Doctor thesis of Kentaro Kaneko, Kyoto Univ. March 2013). According to this non-patent document, it is possible to set a band gap width by mixing indium or aluminum or a combination of indium and aluminum into Gallium oxide ($Ga_2O_3$), which is attractive component for an InAlGaO-based semiconductor.

Also, another non-patent document suggests a method that includes annealing an Sn doped $\alpha$-$Ga_2O_3$ film formed on a c-plane of sapphire substrate to form an annealed buffer layer (See Non-patent document, "Conductivity control and device applications of corundum-structured gallium oxide-based semiconductor" Doctor thesis of Kazuaki Akaiwa, Kyoto Univ. March, 2016). The method also includes forming an Sn doped $\alpha$-$Ga_2O_3$ film formed on the buffer layer to enhance an electron mobility of the Sn doped $\alpha$-$Ga_2O_3$ film.

With the Sn doping, which gave the Sn doped $\alpha$-$Ga_2O_3$ film a surfactant-like effect, surface roughness and crystallinity of the $\alpha$-$Ga_2O_3$ film were improved, and an electron mobility was enhanced. However, there is still a problem by annealing, which might cause a higher resistance of the $\alpha$-$Ga_2O_3$ film and/or an insulation of the $\alpha$-$Ga_2O_3$ film. Furthermore, the $\alpha$-$Ga_2O_3$ film has possibilities of dislocation, and is affected by dislocation scattering, which may cause a deterioration in electrical characteristics, and also may cause cracks.

SUMMARY OF THE INVENTION

In a first aspect of a present inventive subject matter, a crystalline oxide semiconductor film includes a crystalline oxide semiconductor that contains a corundum structure as a major component, a dopant, and an electron mobility that is 30 $cm^2$/Vs or more.

In a second aspect of a present inventive subject matter, a crystalline oxide semiconductor film includes a crystalline oxide semiconductor that contains a corundum structure as a major component, a dopant, and a carrier concentration that is $1.0 \times 10^{18}/cm^3$ or more.

In a third aspect of a present inventive subject matter, a crystalline oxide semiconductor film includes a crystalline oxide semiconductor comprising a corundum structure as a major component, and a dopant that is an n-type dopant. The corundum structure includes a principal plane that is an a-plane or an m-plane.

DETAILED DESCRIPTION OF EMBODIMENTS

Figure 1:
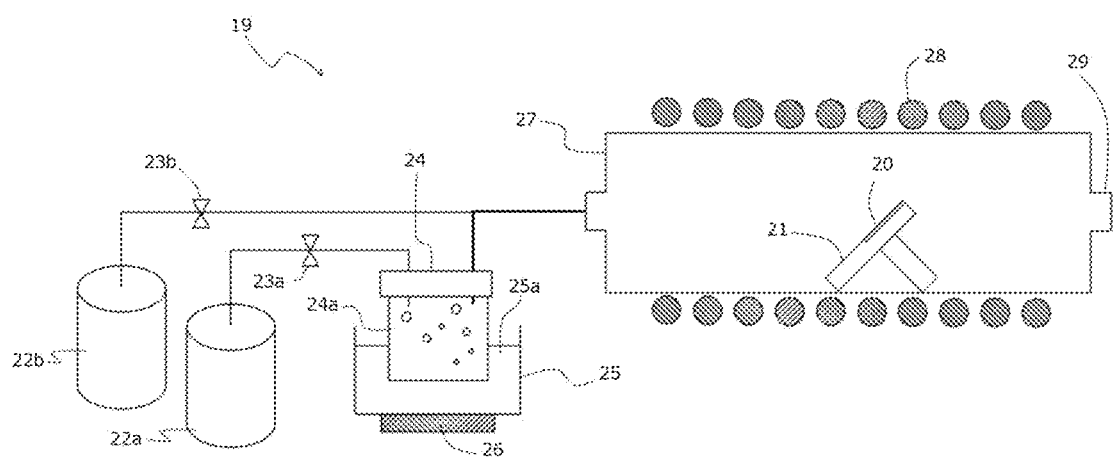
FIG. 1 shows a schematic diagram of a mist chemical vapor deposition (CVD) device to form a crystalline oxide semiconductor film according to a first embodiment of method of a present inventive subject matter.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a film, a device, and/or a system in addition to the orientation depicted in the figures.

A crystalline oxide semiconductor film according to an embodiment of a present inventive subject matter, a crystalline oxide semiconductor film includes a crystalline oxide semiconductor that contains a corundum structure as a major component, a dopant, and an electron mobility that is 30 $cm^2/Vs$ or more.

The term "electron mobility" herein means an electron mobility that is obtainable by a Hall effect measurement. If the electron mobility of a crystalline oxide semiconductor film is higher, the crystalline oxide semiconductor film would be better as a material for a semiconductor device and/or a system including the semiconductor device. Accordingly, a crystalline oxide semiconductor film including an electron mobility that is 40 $cm^2/Vs$ or more would be preferable. Also, a crystalline oxide semiconductor film including an electron mobility that is 50 $cm^2/Vs$ or more would be further preferable. Furthermore, a crystalline oxide semiconductor film including an electron mobility that is 100 $cm^2/Vs$ or more would be most preferable.

Also, it may be suggested that a carrier concentration of the crystalline oxide semiconductor film is $1.0 \times 10^{18}/cm^3$ or more. The term "carrier concentration" herein means a carrier concentration in a crystalline oxide semiconductor film, and the carrier concentration is obtainable by a Hall effect measurement. The crystalline oxide semiconductor film according to an embodiment of a present inventive subject matter has a carrier concentration that may be in a range of $1.0 \times 10^{18}/cm^3$ or more to $1.0 \times 10^{23}/cm^3$ or less. The upper limit of the range of the carrier concentration of a crystalline oxide semiconductor film may be better to be $1.0 \times 10^{22}/cm^3$ than $1.0 \times 10^{23}/cm^3$, since it can further improve properties as a semiconductor.

Furthermore, a crystalline oxide semiconductor film may have an electrical resistivity that is 50 mΩ cm or less. The electrical resistivity of a crystalline oxide semiconductor film that is lower would be better as a material used for a semiconductor device and/or a system including the semiconductor device. Accordingly, a crystalline oxide semiconductor film having an electrical resistivity that is 10 mΩ cm or less would be preferable. Also, a crystalline oxide semiconductor film having an electrical resistivity that is 5 mΩ cm or less would be further preferable.

The crystalline oxide semiconductor film includes a crystalline oxide semiconductor including a corundum structure. The corundum structure includes a principal plane that is an a-plane or an m-plane. The crystalline oxide semiconductor film may include a principal plane that is an m-plane, which may be more enhanced in electrical characteristics than the crystalline oxide semiconductor film including the principal plane that is the a-plane.

The principal plane of the crystalline oxide semiconductor film may include an off-angle. The principal plane of the crystalline oxide semiconductor film is a crystal plane. The term "off-angle" herein means an inclination angle to the principal plane that is as a reference plane. Generally, the term "off-angle" means an inclination angle formed by the principal plane and a crystal growth surface. If the principal plane is an m-plane, the off-angle formed by the principal plane and the crystal growth surface may be inclined to an a-axis from the principal plane. By setting such the off-angle, the crystallinity of the crystalline oxide semiconductor film can be more improved.

The off-angle may be in a range of 0.2° to 12°. The off-angle may be preferable if in a range of 0.5° to 4.0°. The off-angle may be the further preferable if the off-angle is in a range of 0.5° to 3.0°. If the off-angle may be in a better angle range, the crystalline oxide semiconductor film would be better in electrical characteristics, and the electron mobility of the crystalline oxide semiconductor film would be enhanced.

According to an embodiment of a present inventive subject matter, a crystalline oxide semiconductor may contain indium, gallium, or aluminum. According to an embodiment of a present inventive subject matter, a crystalline oxide semiconductor may contain at least one selected among indium, gallium and aluminum. Also, a crystalline oxide semiconductor film according to a present inventive subject matter, the crystalline oxide semiconductor film preferably contains an InAlGaO-based semiconductor. According to an embodiment of a present inventive subject matter, the InAlGaO-based semiconductor may refer to $In_xAl_yGa_zO_3$ with a condition of $0 \leq X \leq 2$, $0 \leq Y \leq 2$, $0 \leq Z \leq 2$, $X+Y+Z=1.5$ to 2.5 as a same group containing Gallium oxide ($Ga_2O_3$), for example.

Furthermore, a crystalline oxide semiconductor film according to an embodiment of a present inventive subject matter further preferably contains at least gallium.

The term "major component" herein means, for example, in a case that a crystalline oxide semiconductor of a crystalline oxide semiconductor film is $\alpha$-$Ga_2O_3$, an atomic ratio of gallium in metal elements in the crystalline oxide semiconductor film may be 0.5 or more.

According to an embodiment of the present inventive subject matter, the atomic ratio of gallium in metal elements in a crystalline oxide semiconductor film is preferably 0.7 or more. For a present inventive subject matter, the atomic ratio of gallium in metal elements in a crystalline oxide semiconductor film is further preferably 0.8 or more.

Furthermore, the thickness of the crystalline oxide semiconductor film may not be particularly limited herein. The thickness of the crystalline oxide semiconductor film may be 1 μm or less. Also, the thickness of the crystalline oxide semiconductor film may be 1 μm or more.

Also, a shape of the crystalline oxide semiconductor film may not be particularly limited herein. The shape of the crystalline oxide semiconductor film may be a quadrangular shape that includes a square and a rectangle. Also, the shape of the crystalline oxide semiconductor film may be a circular shape that includes an ellipse and a semicircle. Furthermore, the shape of the crystalline oxide semiconductor film may be a polygonal shape. The surface area of a crystalline oxide semiconductor film according to an embodiment of a present inventive subject matter may not be particularly limited, however, the surface area may be 3 mm square or more. The surface area may be preferably 5 mm square or more. The surface area may be further preferably 50 mm square or more.

According to an embodiment of a present inventive subject matter, when a crystalline oxide semiconductor film is observed by an optical-microscopic observation, the crystalline oxide semiconductor film is preferably free from a crack in a center area that is 3 mm square. Also, the crystalline oxide semiconductor film is preferably free from a crack in a center area that is 5 mm square, when the crystalline oxide semiconductor film is observed by an optical-microscopic observation. Furthermore, the crystalline oxide semiconductor film is most preferably free from a crack in a center area that is 9.5 mm square.

According to an embodiment of a present inventive subject matter, a crystalline oxide semiconductor film may be a polycrystalline film. Also, according to an embodiment of the present inventive subject matter, a crystalline oxide semiconductor film may be monocrystalline film, that is preferable than the polycrystalline film.

According to an embodiment of a present inventive subject matter, a crystalline oxide semiconductor film contains a dopant. As a dopant, for example, tin, germanium, silicon, titanium, zirconium, vanadium, or niobium is suggested. However, a dopant is not limited thereto, and the dopant may be a known one. Examples of the dopant may include n-type dopants and p-type dopants. The n-type dopant may include lead, as an example. According to an embodiment of a present inventive subject matter, the dopant may be at least one selected among tin, germanium and silicon. Also, according to an embodiment of the present inventive subject matter, the dopant is preferably tin or germanium. The dopant that is further preferably tin. Also, it is noted that impurities may be contained in a crystalline oxide semiconductor film during a film-formation process, for example, and may function as a dopant. Content of dopant in composition of the crystalline oxide semiconductor film may be preferably 0.00001 atom % or more. Also, content of dopant in composition of the crystalline oxide semiconductor film may be preferably to be in a range of 0.00001 atom % to 20 atom %. Furthermore, content of dopant in composition of the crystalline oxide semiconductor film may be further preferably to be in a range of 0.00001 atom % to 10 atom %. If the content of dopant in composition of the crystalline oxide semiconductor film becomes in a range that is preferable or further preferable, the crystalline oxide semiconductor film would be more enhanced in electrical characteristics.

Also, it is preferable that the crystalline oxide semiconductor film shows a half value width of an X-ray rocking curve of an X-ray diffraction, the half value width that is preferably 100 arcsec or more. The half value width that might be preferably 300 arcsec or more. The upper limit of the half value width of the X-ray rocking curve of the X-ray diffraction is not limited herein, however, the upper limit would be preferably 1300 arcsec. The upper limit of the half value width of the X-ray rocking curve of the X-ray diffraction might be further preferably 1100 arcsec.

If the half value width is in a range that is preferable or further preferable, electron mobility of a crystalline oxide semiconductor film would be enhanced. If the half value width is in a range that is preferable or further preferable, the electron mobility of the crystalline oxide semiconductor film would be more enhanced.

The term "half value width" herein means a value that is obtainable by measuring a half value width of the X-ray rocking curve by an x-ray diffraction (XRD). The plane orientation of a plane that is measured is not limited, however, the plane orientation may be, for example, (11-20) or (30-30).

FIG. 1 shows a schematic diagram of a mist chemical vapor deposition (CVD) device to form a crystalline oxide semiconductor film according to a first embodiment of method of a present inventive subject matter.

As one of preferable embodiments according to a present inventive subject matter, a method for producing a crystalline oxide semiconductor film includes atomizing a raw material solution containing a dopant and/or forming droplets of the raw material solution containing the dopant, for example, by use of a mist chemical vapor deposition (CVD) apparatus shown in FIG. 1. This may be an atomization and/or forming droplets process. The method further includes carrying mist and/or droplets, that are obtained through the atomization and/or forming droplets process, to a film-formation chamber by carrier gas. The method may further include a film-formation process to form a crystalline oxide semiconductor film on a crystalline substrate.

With the use of the mist CVD, a crystalline oxide semiconductor film obtained according to an embodiment of a present inventive subject matter is expected to be sufficient in electrical characteristics. Particularly, an electron mobility of the crystalline oxide semiconductor film is expected to be enhanced. Furthermore, the number of cracks is expected to be decreased. Accordingly, the crystalline oxide semiconductor film obtained according to an embodiment of the present inventive subject matter is superior in electron mobility without causing increase in resistance and without being electrically insulated. Even if the half value width of the X-ray rocking curve of the X-ray diffraction of a crystalline oxide semiconductor film is 100 arcsec according to an embodiment of the present inventive subject matter, the electron mobility of the crystalline oxide semiconductor film would be sufficient.

In a film-formation process, a crystalline substrate including a principal plane that may be an a-plane with a corundum structure or an m-plane with a corundum structure is used. The crystalline substrate may include a buffer layer with an off-angle.

In a film-formation process, if a crystalline substrate includes a principal plane that is an a-plane with a corundum structure, a crystalline oxide semiconductor film that is to be formed on the principal plane of the crystalline substrate would obtain a corundum structure including a principal plane that is an a-plane with a corundum structure. Also, in a film-formation process, if a crystalline substrate includes a principal plane that is an m-plane with a corundum structure, a crystalline oxide semiconductor film that is to be formed on the principal plane of the crystalline substrate would obtain a corundum structure including a principal plane that is an m-plane with a corundum structure.

According to an embodiment of a present inventive subject matter, a crystalline substrate including a principal plane that may be an a-plane with a corundum structure or a principal plane that may be an m-plane with a corundum structure, in a condition that the crystalline substrate may include a buffer layer without containing a dopant, which may enhance an electron mobility.

<Crystalline Substrate>

The principal plane of the crystalline substrate may partly include a corundum structure. Also, the principal plane of the crystalline substrate may entirely include a corundum structure, on that a crystalline oxide semiconductor film is to be formed, and thus, principal plane of the crystalline substrate entirely including a corundum structure is preferable according to an embodiment of the present inventive subject matter.

Furthermore, according to the embodiment of a present inventive subject matter mentioned above, if the principal plane of the crystalline substrate is an a-plane with a corundum structure or an m-plane with a corundum structure, the crystalline substrate would be preferable in electrical characteristics.

Also, according to an embodiment of the present inventive subject matter, the crystalline substrate may include an off-angle. The off-angle may be in a range of 0.2° to 12°. The off-angle may be preferable if the off-angle is in a range of 0.5° to 4.0°. The off-angle may be further preferable if the off-angle is in a range of 0.5° to 3.0°.

The crystalline substrate may have a plate shape, however, the crystalline substrate may be a supporting member of the crystalline oxide semiconductor film, and thus, the shape of the crystalline substrate is not limited to the plate shape. The shape of the crystalline substrate may be, for example, a circular shape. The circular shape may include shapes of a circle and/or an ellipse. The shape of the crystalline substrate may be, for example, a polygonal shape. The polygonal shape may include a triangle, a square, a rectangle, a pentagon, a hexagon, a hexagon, a heptagon, an octagon and a nonagon. Accordingly, a crystalline substrate according to an embodiment of the present inventive subject matter, the shape of the crystalline substrate would be selectable to form a crystalline oxide film in a desired shape on the crystalline substrate.

Furthermore, according to an embodiment of a present inventive subject matter, the crystalline substrate may have a larger area to form a crystalline oxide film that has a larger area on the crystalline substrate.

Also, a crystalline substrate may be an electrically-conductive substrate, however, according to an embodiment of a present inventive subject matter, a crystalline substrate that is electrically-insulative would be preferable. Also, a crystalline substrate including a metal layer on a surface of the crystalline substrate would be preferable according to an embodiment of the present inventive subject matter.

A material of the crystalline substrate is not limited to a particular material, and may be a known material, if an object of the present inventive subject matter is not interfered with. The material of the crystalline substrate including a corundum structure, may be $\alpha$-$Al_2O_3$ as a sapphire substrate, for example. Also, the material of the crystalline substrate including a corundum structure may be $\alpha$-$Ga_2O_3$. Furthermore, the material of the crystalline substrate including a corundum structure may be an a-plane sapphire substrate, an m-plane sapphire substrate, or a gallium oxide substrate (a-plane or m-plane) as preferable examples of the material of the crystalline substrate.

As the buffer layer without containing a dopant, $\alpha$-$Fe_2O_3$, $\alpha$-$Ga_2O_3$, $\alpha$-$Al_2O_3$ and/or a mixed crystal of $\alpha$-$Fe_2O_3$, $\alpha$-$Ga_2O_3$ and $\alpha$-$Al_2O_3$ are suggested as preferred examples. According to an embodiment of a present inventive subject matter, the buffer layer is preferably $\alpha$-$Ga_2O_3$. A lamination method of the buffer layer is not limited herein. The lamination method of the buffer layer may be a known lamination method. Also, the lamination method of the buffer layer may be the same as a lamination method for forming a crystalline oxide semiconductor film on a crystalline substrate.

<Atomization and/or Forming Droplets Process>

At the atomization and/or forming droplets process, the raw material solution containing a dopant is atomized and/or droplets of the raw material solution containing the dopant are formed. A method to atomize the raw material solution and/or to form droplets of the raw material solution is not limited herein. The method to atomize the raw material solution and/or to form droplets of the raw material solution may be a known method if the raw material solution is able to be atomized and/or formed into droplets. According to an embodiment of the present inventive subject matter, atomizing the raw material solution containing the dopant by ultrasonic waves to obtain mist and/or forming droplets from the raw material solution containing the dopant by ultrasonic waves is preferable. The mist or droplets obtained using ultrasonic waves have an initial rate of zero to be suspended in the air. The mist obtained using ultrasonic waves is capable of being suspended in a space to be delivered as a gas, is not blown like a spray, for example, and thus, is not damaged by collision energy. Accordingly, the mist obtained using ultrasonic waves is preferable. The size of droplet may not be particularly limited and a droplet may be of approximately several mm, however, according to an embodiment of the present inventive subject matter, the size of droplet may be in a range of 0.1 μm to 10 μm.

<Raw Material Solution>

The raw material solution is a solution from that the crystalline oxide semiconductor is obtainable by using a mist CVD (Chemical Vapor Deposition) apparatus.

If the raw material solution contains the dopant, the solution is not particularly limited. According to an embodiment of a present inventive subject matter, the raw material solution may be a solution of an organometallic complex of metal (e.g., acetylacetonate complex, or the like) or halide (e.g., fluoride, chloride, bromide, or iodide). The metal may be a metal that is able to be at least a part of a semiconductor. Examples of the metal include gallium, indium, aluminum and iron. According to an embodiment of a present inventive subject matter, the raw material solution may contain at least one selected among gallium, indium, and aluminum. Also, according to an embodiment of the present inventive subject matter, the raw material solution may preferably contain at least gallium. Metal content in the raw material solution is not limited only if an object of the present inventive subject matter is not interfered with, however, metal content in the raw material solution may be in a range of 0.001 mol % to 50 mol %. According to an embodiment of the present inventive subject matter, metal content in the raw material solution may be preferably in a range of 0.01 mol % to 50 mol %.

Also, the raw material solution typically contains a dopant. Due to the dopant contained in the raw material solution, controllability of electrical conductivity of a crystalline oxide semiconductor film is enhanced without ion implantation and also without breaking a crystal structure.

If the metal contained in the raw material solution include at least gallium, the dopant may be an n-type dopant. The n-type dopant may be suggested to be tin, germanium, silicon, or lead. Also, according to an embodiment of a present inventive subject matter, the dopant may be tin, germanium or silicon. According to an embodiment of the present inventive subject matter, the dopant may be preferably tin or germanium. Furthermore, according to an embodiment of a present inventive subject matter, the dopant may be further preferably tin. The dopant concentration in general may be in a range of $1\times10^{16}/cm^3$ to $1\times10^{22}/cm^3$. Also, the dopant concentration may be at a lower concentration of, for example, approximately $1\times10^{17}/cm^3$ or less.

Furthermore, the dopant concentration may be at a higher concentration of, for example, approximately $1\times10^{20}/cm^3$ or more. According to an embodiment of a present inventive subject matter, the dopant concentration may be preferably $1\times10^{20}/cm^3$ or less. Also, according to an embodiment of a present inventive subject matter, the dopant concentration may be further preferably $5\times10^{19}/cm^3$ or less. A solvent of the raw material solution is not particularly limited, and thus, the solvent may be an inorganic solvent that includes water and the solvent may be an organic solvent that includes alcohol. Furthermore, the solvent of the raw material solution may be a mixed solvent of the inorganic solvent and the organic solvent.

According to an embodiment of a present inventive subject matter, a solvent of the raw material solution that contains water is preferable. According to an embodiment of the present inventive subject matter, a solvent of the raw material solution that contains a mixed solvent of water and alcohol may be further preferable. According to an embodiment of a present inventive subject matter, a solvent of the raw material solution is water, that is most preferable. Regarding the water in details, the water may include, for example, pure water, ultrapure water, tap water, well water, mineral water, hot spring water, spring water, fresh water and ocean water. According to an embodiment of the present inventive subject matter, ultrapure water is preferable.

<Carrying Mist and/or Droplets Process>

At the process for carrying mist and/or droplets, the mist and/or droplets are delivered into a film-formation chamber by carrier gas. The carrier gas is not limited only if an object of the present inventive subject matter is not interfered with, and thus, the carrier gas may be an inert gas such as oxygen, ozone, nitrogen, and argon, and a reducing gas. Also, the carrier gas may be a reducing gas that may be a hydrogen gas and/or a forming gas. The type of carrier gas may be one or more, and a dilution gas at a reduced flow rate (e.g., 10-fold dilution gas) and the like may be used further as a second carrier gas. The carrier gas may be supplied from one or more locations. While the flow rate of the carrier gas is not particularly limited, the flow rate of the carrier gas may be in a range of 0.01 to 20 L/min. According to an embodiment of the inventive subject matter, the flow rate of the carrier gas may be preferably in a range of 1 to 10 L/min. When a dilution gas is used, the flow rate of the dilution gas may be in a range of 0.001 to 2 L/min. Furthermore, according to an embodiment of an inventive subject matter, when a dilution gas is used, the flow rate of the dilution gas may be in a range of 0.1 to 1 L/min.

<Film-Formation Process>

At the film-formation process, a crystallinity oxide semiconductor layer is formed on a crystalline substrate by thermal reaction of the mist and/or droplets of the raw material solution. The term "thermal reaction" herein includes just a reaction of the mist and/or droplets by heat. Conditions of reaction are not particularly limited only if an object of a present inventive subject matter is not interfered with. In the film-formation process, the thermal reaction is conducted at an evaporation temperature or higher temperature of the evaporation temperature of the solvent of the raw material solution. During the thermal reaction, the temperature should not be too high. For example, the temperature during the thermal reaction may be 1000° C. or less. The temperature during the thermal reaction is preferably 650° C. or less. According to an embodiment of the present inventive subject matter, the temperature during the thermal reaction is further preferably in a range of 400° C. to 650° C. Also, the thermal reaction may be conducted in any atmosphere of a vacuum, a non-oxygen atmosphere, a reducing-gas atmosphere, and an oxygen atmosphere. Also, the thermal reaction may be conducted in any condition of under an atmospheric pressure, under an increased pressure, and under a reduced pressure. According to an embodiment of a present inventive subject matter, the thermal reaction is preferably conducted under an atmospheric pressure. Also, a film thickness of crystalline oxide semiconductor film is able to be set by adjusting a film-formation time.

A crystalline oxide semiconductor film obtained according to an embodiment of a present inventive subject matter is expected to be sufficient in electrical characteristics. Particularly, an electron mobility of the crystalline oxide semiconductor film is expected to be enhanced. Furthermore, the number of cracks is expected to be decreased. Accordingly, the crystalline oxide semiconductor film obtained according to an embodiment of a present inventive subject matter is useful in a technological field, especially for a semiconductor device and/or a system using the semiconductor device. According to an embodiment of a present inventive subject matter, the semiconductor device may be a power device.

For example, the crystalline semiconductor film may be used for a n-type semiconductor layer that includes an $n^+$-type semiconductor layer and an $n^-$-type semiconductor layer. Also, according to an embodiment of a present inventive subject matter, the crystalline semiconductor film may be used just as it is. Furthermore, according to an embodiment of a present inventive subject matter, a crystalline semiconductor film that is peeled off from a crystalline substrate may be used for a semiconductor device, for example. It is possible to peel off the crystalline semiconductor film from the crystalline substrate by a known method.

Semiconductor devices may be categorized into lateral devices and vertical devices. In a lateral device, a first electrode and a second electrode may be formed on one side of a semiconductor layer. In a vertical device, a first electrode may be formed on a first side of a semiconductor layer, and a second electrode may be formed on a second side of the semiconductor layer. The first side may be positioned opposite to the second side of the semiconductor layer.

According to an embodiment of a present inventive subject matter, the crystalline oxide semiconductor film may be used for the lateral devices and also used for vertical devices. According to an embodiment of a present inventive subject matter, the crystalline oxide semiconductor film may be preferably used for vertical devices. Examples of the semiconductor device include Schottky barrier diodes (SBDs), metal semiconductor field-effect transistors (MESFETs), high-electron-mobility transistors (HEMTs), metal oxide semiconductor field-effect transistors (MOSFETs), static induction transistors (SITs), junction field-effect transistors (JFETs), insulated gate bipolar transistors (IGBTs), and light-emitting diodes.

According to an embodiment of a present inventive subject matter, a crystalline oxide semiconductor device includes the crystalline oxide semiconductor film as an n-type semiconductor layer. The n-type semiconductor layer may be configured to be the $n^+$-type semiconductor layer and also the $n^-$-type semiconductor layer) in a semiconductor device. Regarding semiconductor devices mentioned below, only if an object of the present inventive subject matter is not interfered with, a semiconductor device may include a crystalline oxide semiconductor film formed on a crystalline substrate. Also, a semiconductor device may include a crystalline oxide semiconductor film that was peeled off from a crystalline substrate.

Figure 2:
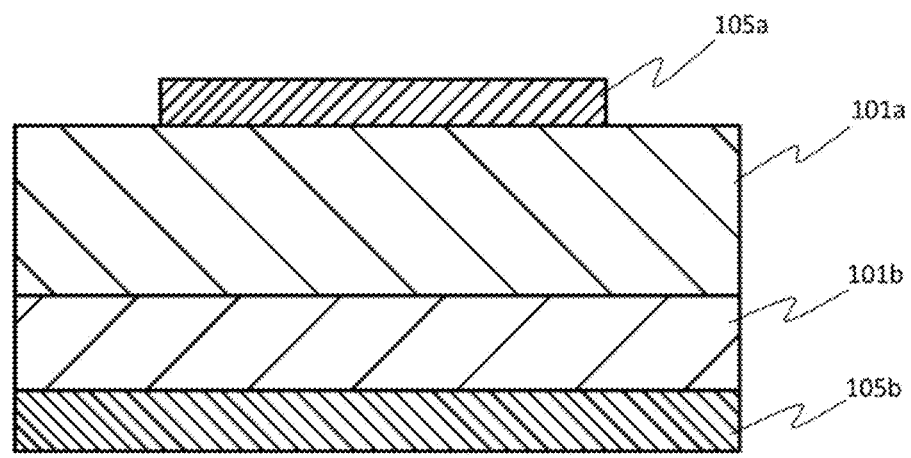
FIG. 2 shows a schematic view of a first embodiment of a crystalline oxide semiconductor device according to a present inventive subject matter.

FIG. 2 shows a schematic view of a first embodiment of a crystalline oxide semiconductor device according to a present inventive subject matter.

In this embodiment, the crystalline oxide semiconductor device may be a Schottky barrier diode (SBD). The SBD shown in FIG. 2 includes an n⁻-type semiconductor layer 101a, an n⁺-type semiconductor layer 101b, a Schottky electrode 105a, and an ohmic electrode 105b.

The material of Schottky electrode and ohmic electrode may be a known electrode material. Examples of such an electrode material include metals, containing Al, Mo, Co, Zr, Sn, Nb, Fe, Cr, Ta, Ti, Au, Pt, V, Mn, Ni, Cu, Hf, W, Ir, Zn, In, Pd, Nd, Ag, and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

Also, the Schottky electrodes and ohmic electrodes can be formed by a known method such as vacuum evaporation or sputtering. For more details, as an example, if two metals that are a first metal and a second metal are selected among the metals mentioned above as the examples for an electrode material, a first layer of the first metal and a second layer of the second metal are laminated together. Then, using photolithography, for example, can form a pattern at the first layer and at the second layer.

When a reverse bias is applied to the SBD shown in FIG. 2, a depletion layer (not shown) expands in the n-type semiconductor layer 101a. When a forward bias is applied, electrons flow from the ohmic electrode 105b to the Schottky electrode 105a. Accordingly, the SBD becomes a high-voltage SBD and a large current is applicable to the SBD with an enhanced switching speed.

Figure 3:
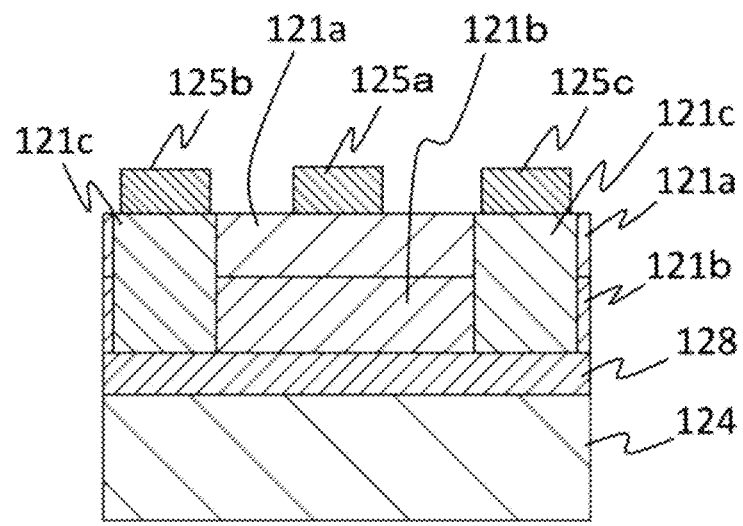
FIG. 3 shows a schematic view of a second embodiment of a crystalline oxide semiconductor device according to a present inventive subject matter.

FIG. 3 shows a schematic view of a second embodiment of a crystalline oxide semiconductor device according to a present inventive subject matter. In this embodiment, the crystalline oxide semiconductor device is a high-electron-mobility transistor (HEMT). The HEMT shown in FIG. 3 includes a wide-band-gap n-type semiconductor layer 121a, a narrow-band-gap n-type semiconductor layer 121b, an n⁺-type semiconductor layer 121c, a semi-insulator layer 124, a buffer layer 128, a gate electrode 125a, a source electrode 125b, and a drain electrode 125c.

Figure 4:
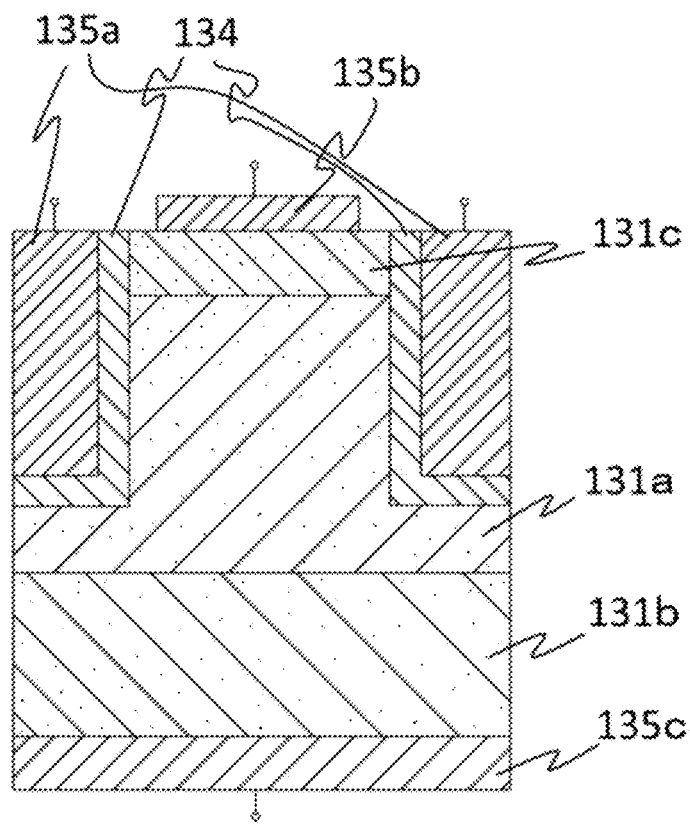
FIG. 4 shows a schematic view of a third embodiment of a crystalline oxide semiconductor device according to a present inventive subject matter.

FIG. 4 shows a schematic view of a third embodiment of a crystalline oxide semiconductor device according to a present inventive subject matter.

In this embodiment, the crystalline oxide semiconductor device is a metal oxide semiconductor field-effect transistors (MOSFET). The MOSFET shown in FIG. 4 is a trench MOSFET and includes an n⁻-type semiconductor layer 131a, a first n⁺-type semiconductor layer 131b and a second n⁺-type semiconductor layer 131c, a gate insulating film 134, a gate electrode 135a, a source electrode 135b, and a drain electrode 135c.

Figure 5:
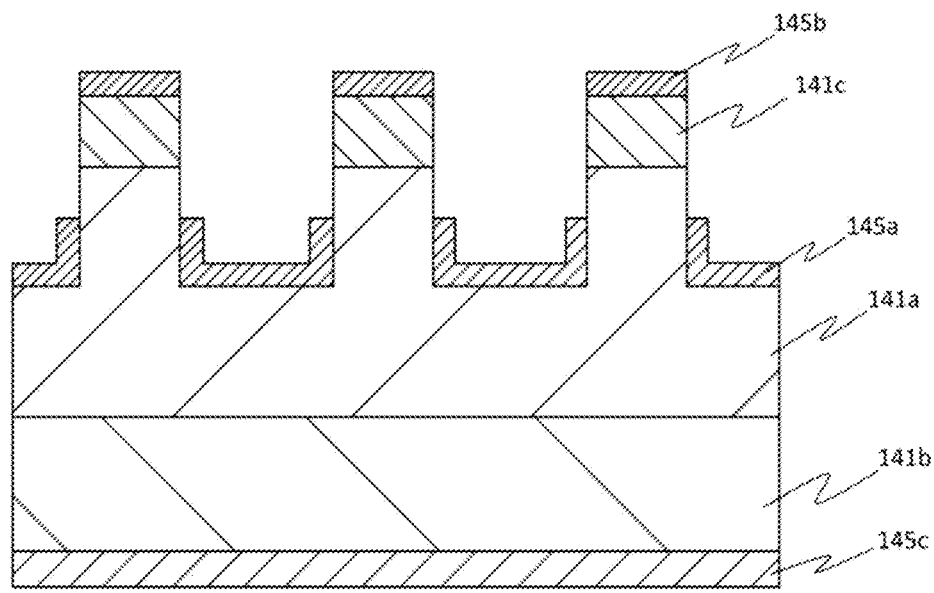
FIG. 5 shows a schematic view of a fourth embodiment of a crystalline oxide semiconductor device according to a present inventive subject matter.

FIG. 5 shows a schematic view of a fourth embodiment of a crystalline oxide semiconductor device according to a present inventive subject matter. In this embodiment, the crystalline oxide semiconductor device is a junction field-effect transistor (JFET) including an n⁻-type semiconductor layer 141a, a first n⁺-type semiconductor layer 141b, a second n⁺-type semiconductor layer 141c, a gate electrode 145a, a source electrode 145b, and a drain electrode 145c.

Figure 6:
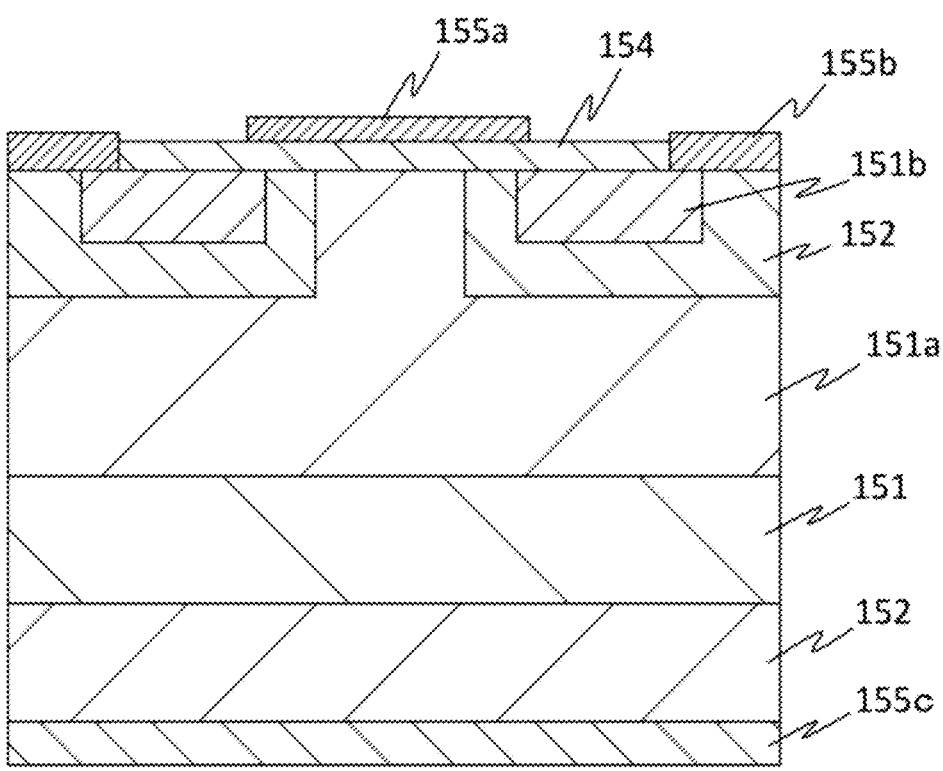
FIG. 6 shows a schematic view of a fifth embodiment of a crystalline oxide semiconductor device according to a present inventive subject matter.

FIG. 6 shows a schematic view of a fifth embodiment of a crystalline oxide semiconductor device according to a present inventive subject matter. In this embodiment, the crystalline oxide semiconductor device is an insulated gate bipolar transistor (IGBT) including an n-type semiconductor layer 151, n⁻-type semiconductor layer 151a, n⁺-type semiconductor layer 151b, a p-type semiconductor layer 152, a gate insulating film 154, a gate electrode 155a, an emitter electrode 155b, and a collector electrode 155c.

Figure 7:
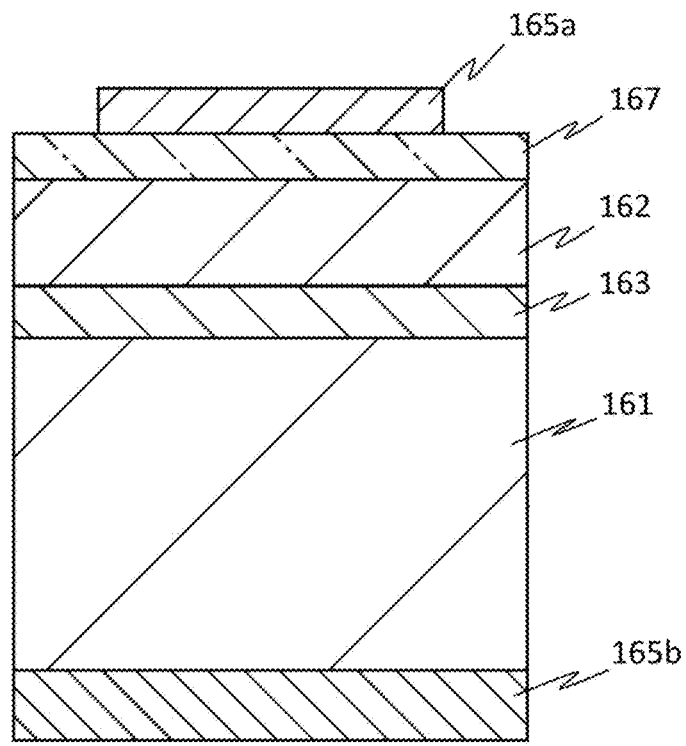
FIG. 7 shows a schematic view of a sixth embodiment of a crystalline oxide semiconductor device according to a present inventive subject matter.

FIG. 7 shows a schematic view of a sixth embodiment of a crystalline oxide semiconductor device according to a present inventive subject matter. In this embodiment, the crystalline oxide semiconductor device is a light-emitting element. The light-emitting element may be a light-emitting diode (LED). The LED shown in FIG. 7 In the semiconductor light-emitting device includes a first electrode 165a, a second electrode 165b, an n-type semiconductor layer 161 arranged on the second electrode 165b, a light-emitting layer 163 being laminated on the n-type semiconductor layer 161, and a p-type semiconductor layer 162 being laminated on the light-emitting layer 163. The semiconductor light-emitting device further includes a light-transmitting electrode 167 that is arranged on the p-type semiconductor layer 161. The light-transmitting electrode 167 may be a transparent electrode or a translucent electrode. The light-transmitting electrode 167 is configured to transmit light emitted by the light-emitting layer 163 that is disposed on the p-type semiconductor layer 162. The first electrode 165a included in the crystalline oxide semiconductor device is laminated on the light-transmitting electrode 167. The light-emitting element may be covered by a protective layer except for at least some parts of the electrodes that are the first electrode, the second electrode and the light-transmitting electrode.

Examples of the material of the light-transmitting electrode include conductive oxide materials containing indium (In) or titanium (Ti). More specific examples include $In_2O_3$, $ZnO$, $SnO_2$, $Ga_2O_3$, $TiO_2$, $CeO_2$ and/or mixed crystals of two or more selected among $In_2O_3$, $ZnO$, $SnO_2$, $Ga_2O_3$, $TiO_2$, and $CeO_2$, or doped ones of these materials. The light-transmitting electrode can be formed from the above materials by known a known method such as sputtering. Also, the light-transmitting electrode may be thermally annealed after the light-transmitting electrode is arranged on the p-type semiconductor layer 161 to enhance transparency of the light-transmitting electrode.

According to the light-emitting element that is a semiconductor device shown in FIG. 7, when an electrical current is applied through the first electrode 165a as a positive electrode and the second electrode 165b as a negative electrode to the p-type semiconductor layer 162, light-emitting layer 163, and n-type semiconductor layer 161, the light-emitting layer 163 emits light.

Examples of the material of the first electrode 165a and the second electrode 165b include metals, containing Al, Mo, Co, Zr, Sn, Nb, Fe, Cr, Ta, Ti, Au, Pt, V, Mn, Ni, Cu, Hf, W, Ir, Zn, In, Pd, Nd, and Ag, and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. The electrode may be formed using any film-forming method and, for example, may be formed on the crystalline substrate using a method which is appropriately selected from among wet methods such as printing, spraying, and coating, physical methods such as vacuum evaporation, sputtering, and ion plating, chemical methods such as CVD and plasma CVD, and the like considering the suitability for the electrode material.

Figure 8:
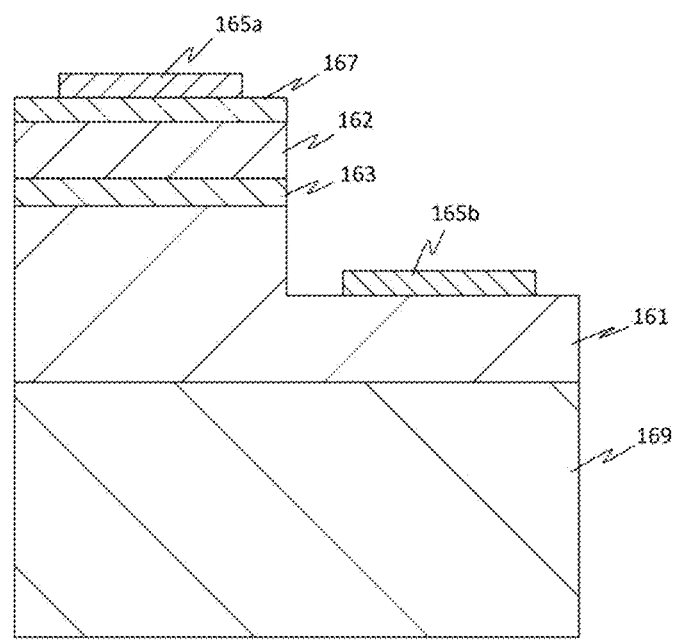
FIG. 8 shows a schematic view of a seventh embodiment of a crystalline oxide semiconductor device according to a present inventive subject matter.

FIG. 8 shows a schematic view of a seventh embodiment of a crystalline oxide semiconductor device according to a present inventive subject matter. FIG. 8 shows another form of light-emitting device. In the light-emitting device in FIG. 16, an n-type semiconductor layer 161 is laminated on a crystalline substrate 169, and a second electrode 165b is laminated on part of a surface of the n-type semiconductor layer 161 exposed by cutting off respective parts of a p-type semiconductor layer 162, a light-emitting layer 163, and the n-type semiconductor layer 161.

Figure 9:
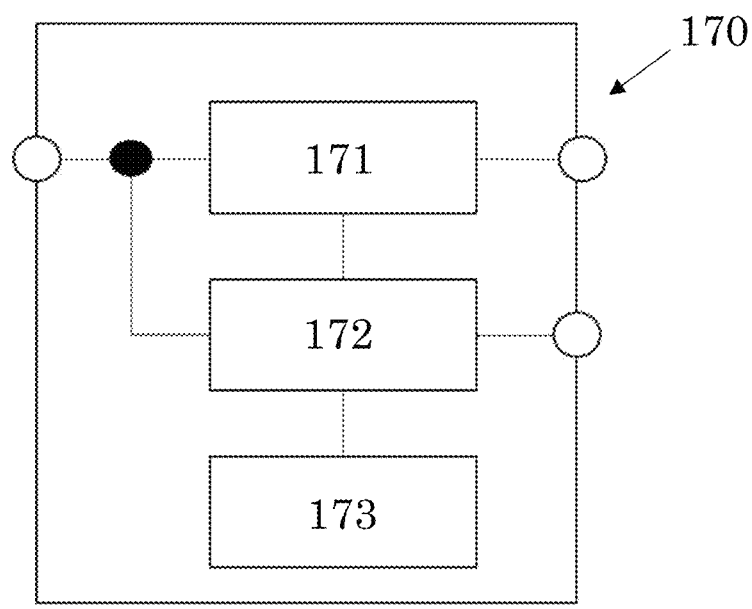
FIG. 9 shows a schematic view of a crystalline oxide semiconductor system according to an eighth embodiment of a present inventive subject matter.

The crystalline oxide semiconductor device according to an embodiment of the present inventive subject matter is, for example, used in a system including a power supply. The crystalline oxide semiconductor device may be electrically connected to the crystalline oxide semiconductor device by use of a known method. The crystalline oxide semiconductor device, for example, electrically connected to electrodes and/or wiring patterns of a motherboard of the system. FIG. 9 shows a schematic view of a crystalline oxide semiconductor system according to an eighth embodiment of a present inventive subject matter. The crystalline oxide semiconductor system may be a power system 170. The power system 170 may include two or more power devices and a control circuit. The power system 170 shown in FIG. 9 includes a first power system 171 and a second power system 172 and a control circuit 173 that are electrically connected in the power system 170.

Figure 10:
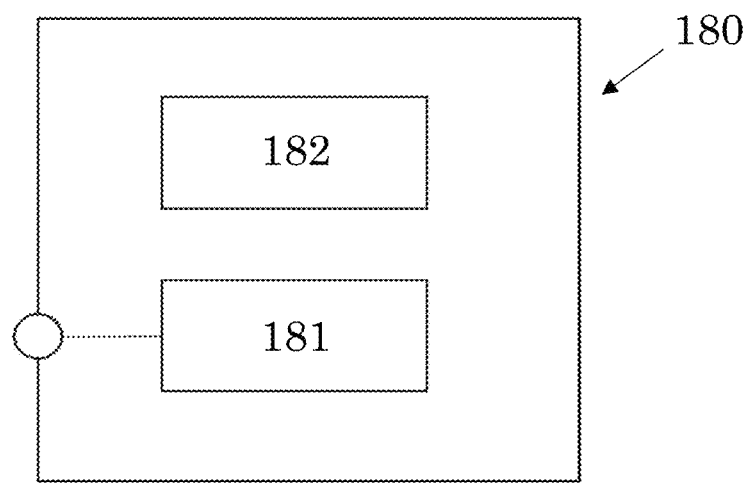
FIG. 10 shows a schematic view of a crystalline oxide semiconductor system according to a ninth embodiment.

FIG. 10 shows a schematic view of a crystalline oxide semiconductor system according to a ninth embodiment. The crystalline oxide semiconductor system may be a system device 180, as shown in FIG. 10, the system device 180 may include a power system 181 and an electric circuit 182 that may be combined with the power system 181.

Figure 11:
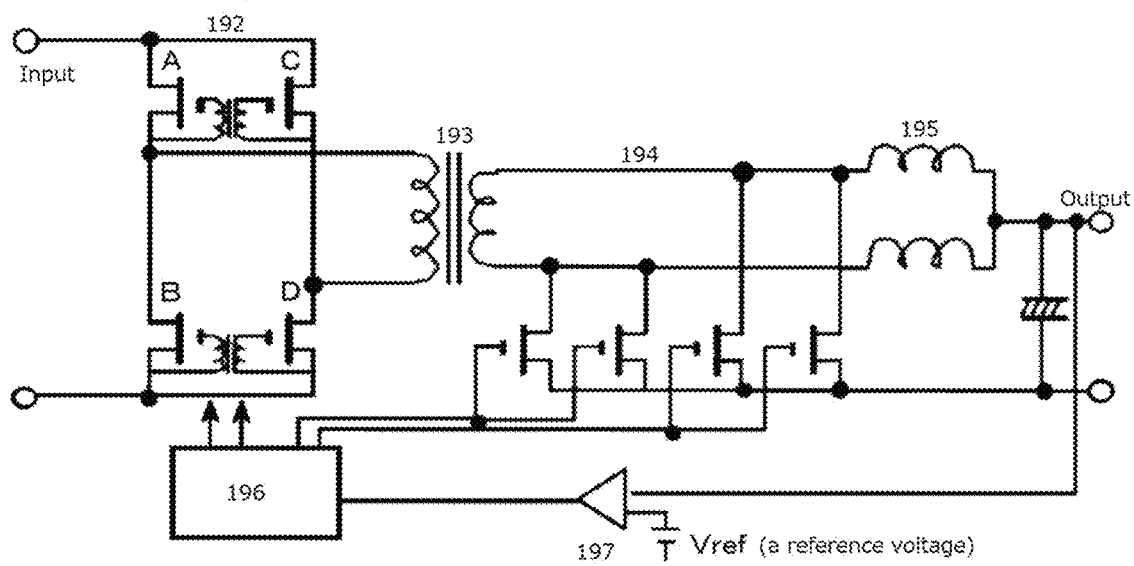
FIG. 11 shows a schematic view of a circuit diagram of power supply of a crystalline oxide semiconductor system according to a tenth embodiment.
Figure 12:
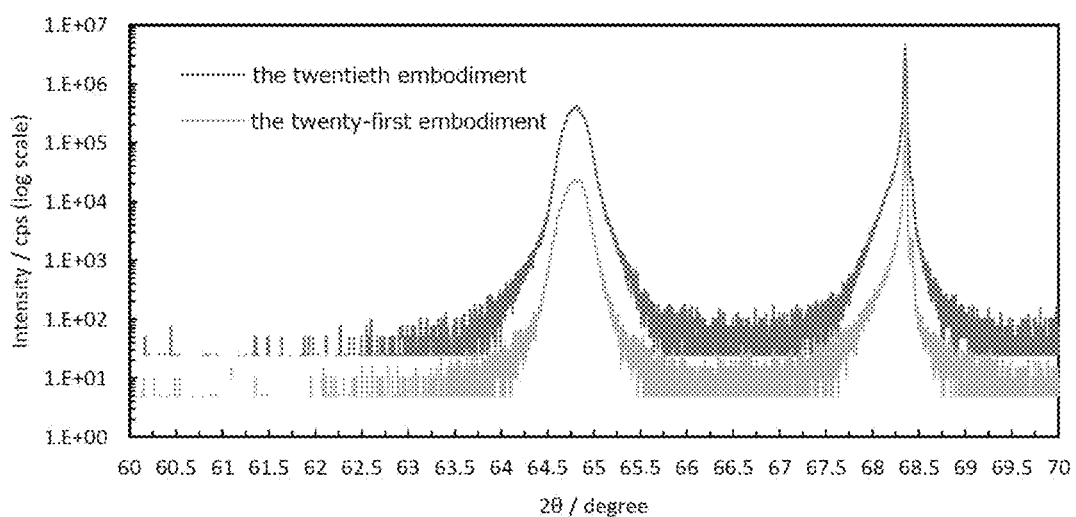
FIG. 12 shows a measurement result of an embodiment measured by an X-ray diffraction (XRD).

FIG. 11 shows a schematic view of a circuit diagram of power supply of a crystalline oxide semiconductor system according to a tenth embodiment. FIG. 11 illustrates a power supply circuit 191 of a power supply device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFETs 194 and then smoothed by a DCL 195 (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

In addition to the above description, an embodiment of the inventive subject matter is described.

A First Embodiment of Method, According to a Present Inventive Subject Matter Regarding a film-formation device, a CVD apparatus 19 used in an embodiment of method according to the inventive subject matter will be described with FIG. 1. The CVD apparatus 19 may include a susceptor 21 on which a crystalline substrate 20 is placed. The CVD apparatus 19 further includes a carrier gas supply device 22a, a first flow-control valve 23a to control a flow of a carrier gas that is configured to be sent from the carrier gas supply device 22a, a diluted carrier gas supply device 22b, a second flow-control valve 23b to control a flow of a carrier gas that is configured to be sent from the carrier gas supply device 22b, a mist source 24 in that a raw material solution 24a is contained, a container 25 in that water 25a is contained, an ultrasonic transducer that may be attached to a bottom surface of the container 25, a supply pipe 27 that may be a quartz pipe with an inside diameter that may be 40 mm, and a heater 28 arranged at a peripheral portion of the supply pipe. The susceptor 21 includes a surface that is slanted off the horizontal and on that the crystalline substrate is arranged. The susceptor 21 is made of quartz. Since the susceptor 21 and the supply pipe 27 that is configured to be a film-formation chamber are made of quartz, this configuration reduces a possibility that a foreign substance entering a crystalline oxide semiconductor film that is formed on the crystalline substrate.

Regarding making a raw material solution according to an embodiment of a present inventive subject matter, gallium acetylacetonate and tin (II) chloride dihydrate are mixed in pure water to be the raw material solution with the atomic ratio of tin to gallium that is 1:0.002 and with amount of gallium that is 0.05 mol/L, and also hydrochloric acid is added to the raw-material solution at a volume percent of 1.5% to be the raw material solution 24a.

As a preparation for a film-formation process, the raw material solution 24a obtained above is contained in a mist source 24. Then, as a crystalline substrate 20, an m-plane sapphire substrate on that a non-doped $\alpha$-$Ga_2O_3$ as a buffer layer is laminated is placed on the susceptor 21, and then a heater 28 is activated to raise the temperature in the film-formation chamber 27 up to 460° C. The first flow-control valve 23a and the second flow-control valve 23b are opened to supply a carrier gas from a carrier gas supply device 22a and a diluted carrier gas from a diluted carrier gas supply device 22b to the film-formation chamber 27 to replace the atmosphere in the film-formation chamber 27 sufficiently with the carrier gas. After that, the flow of the carrier gas from the carrier gas supply device 22a is controlled to be 1.0 L/min, and the flow of the diluted carrier gas from the diluted carrier gas supply device 22b are controlled to be 0.5 L/min. As the carrier gas and the diluted carrier gas according to an embodiment of the inventive subject matter, a gas of nitrogen may be used.

Regarding a formation of a crystalline oxide semiconductor film, an ultrasonic transducer may be oscillated at 2.4 MHz. The oscillation caused by the ultrasonic transducer is propagated through water 25a to the raw-material solution 24a to atomize the raw-material solution 24a to form atomized particles of the raw material.

The atomized particles of the raw material are introduced in the film-formation chamber 27 by the carrier gas, and the atomized particles of the raw material is thermally reacted in the film-formation chamber 27 under an atmospheric pressure at a temperature that may be 460° C. Accordingly, a crystalline oxide semiconductor film is formed on the crystalline substrate 20. According to an experiment, the crystalline oxide semiconductor film with the thickness that is 2.5 μm was formed as mentioned above, and it took 360 minutes to form the crystalline oxide semiconductor film.

Subsequently, the ultrasonic transducer 26 was oscillated at 2.4 MHz so that the vibration was propagated to the raw-material solution 24a through the water 25a. Thus, the raw-material solution 24a was atomized into raw-material fine particles.

A Second Embodiment to a Fourth Embodiment of Method, According to a Present Inventive Subject Matter According to the first embodiment of method above, except for using an m-plane of a sapphire substrate as a crystalline substrate, crystalline oxide semiconductor films were similarly obtained. The m-plane of the sapphire substrate includes an off-angle. The off-angle of the sapphire substrate is 0.5°, according to a second embodiment for method of the present inventive subject matter, and the crystalline oxide semiconductor film has a thickness that is 3.0 μm. Also, according to a third embodiment of method for the present inventive subject matter, the off-angle of the sapphire substrate is 2.0°, and the crystalline oxide semiconductor film has a thickness that is 2.9 μm. Furthermore, according to an embodiment of the present inventive subject matter, the off-angle of the sapphire substrate is 3.0°, and the crystalline oxide semiconductor film has a thickness that is 3.3 μm.

A Fifth Embodiment of Method

To check the reproductivity of the method, similarly to the fourth embodiment, a crystalline oxide semiconductor film was obtained. The crystalline oxide semiconductor film that was obtained has a thickness that is 3.4 μm. The checks of the reproductivity were conducted as following experimental examples. Also, as shown in the Table 1, it is confirmed that their reproductivity is in a certain level. Also, the thickness of the crystalline oxide semiconductor film confirms their reproductivity.

A Sixth Embodiment of Method

Also, in this embodiment, following three conditions are different from conditions in the first embodiment of method, however, other conditions adopted in the first embodiment of method are similarly adopted in this embodiment.

The first condition of the three conditions is that as a raw-material solution, gallium bromide and tin bromide were added in ultrapure water, an aqueous solution was prepared from gallium bromide and tin bromide such that the atomic ratio of gallium to tin was 1:0.08 with gallium that was 0.1 mol/L, and hydrobromic acid was added to the aqueous solution at a volume percent of 10%.

The second condition of the three conditions is that an a-plane sapphire substrate without a buffer layer being laminated on the a-plane sapphire substrate is used as a crystalline substrate, instead of using an m-plane sapphire substrate with a non-doped $\alpha$-$Ga_2O_3$ as a buffer layer being laminated on the m-plane sapphire substrate.

The third condition of the three conditions is that the film-formation time is set to be 10 minutes.

Accordingly, a crystalline oxide semiconductor film was obtained, similarly to the first embodiment of the method.

A Seventh Embodiment of Method

In this embodiment, instead of using an a-plane sapphire substrate without a buffer layer being laminated on the a-plane sapphire substrate, an a-plane sapphire substrate with a non-doped $\alpha$-$Ga_2O_3$ film being laminated as a buffer layer on the a-plane sapphire substrate is used. Except for using the a-plane sapphire substrate with an $\alpha$-$Ga_2O_3$ film being laminated on the a-plane sapphire substrate, other conditions adopted in this embodiment were similarly to the sixth embodiment, and a crystalline oxide semiconductor film was obtained. The thickness of the crystalline oxide semiconductor film that was obtained in this embodiment was 0.3 μm.

An Eighth Embodiment of Method

To check the reproductivity of the method, similarly to the seventh embodiment, a crystalline oxide semiconductor film was obtained. The crystalline oxide semiconductor film that was obtained in this embodiment had a thickness that is 0.3 μm. The checks of the reproductivity were conducted as following experimental examples. Also, as shown in the Table 1, it is confirmed that their reproductivity is in a certain level. Also, the thickness of the crystalline oxide semiconductor film confirms their reproductivity.

A Ninth Embodiment of Method

In this embodiment, following two conditions are different from conditions in the first embodiment of method, however, other conditions adopted in the first embodiment of method are similarly adopted in this embodiment.

The first condition of the two different conditions is that an a-plane sapphire substrate with an Sn-doped $\alpha$-$Ga_2O_3$ as a buffer layer being laminated on the a-plane sapphire substrate is used as a crystalline substrate, instead of using an m-plane sapphire substrate with a non-doped $\alpha$-$Ga_2O_3$ as a buffer layer being laminated on the m-plane sapphire substrate.

The second condition of the two conditions is that the film-formation time is set to be 180 minutes.

Accordingly, a crystalline oxide semiconductor film was obtained similarly to the first embodiment of method.

A Tenth Embodiment of Method

In this embodiment, following two conditions are different from conditions in the first embodiment of method, however, other conditions adopted in the ninth embodiment of method are similarly adopted in this embodiment.

The first condition of the two different conditions is that an a-plane sapphire substrate with a non-doped $\alpha$-$Ga_2O_3$ as a buffer layer being laminated on the a-plane sapphire substrate is used as a crystalline substrate.

The second condition of the two conditions is that gallium and tin in the raw-material solution to be set as the atomic ratio of gallium to tin being 1:0.0002.

Accordingly, a crystalline oxide semiconductor film was obtained similarly to the first embodiment of method. The thickness of the crystalline oxide semiconductor film that was obtained in this embodiment was 1.0 μm.

An Eleventh Embodiment of Method

In this embodiment, following one condition is different from the condition in the ninth embodiment of method, however, other conditions adopted in the ninth embodiment of method are similarly adopted in this embodiment.

The one condition different from the condition adopted in the ninth embodiment is that an a-plane sapphire substrate without a buffer layer being laminated on the a-plane sapphire substrate, instead of using an a-plane sapphire substrate with an Sn-doped $\alpha$-$Ga_2O_3$ film as a buffer layer being laminated on the a-plane sapphire substrate.

Accordingly, a crystalline oxide semiconductor film was obtained similarly to the ninth embodiment of method. The thickness of the crystalline oxide semiconductor film that was obtained in this embodiment was 0.9 μm.

A Twelfth Embodiment of Method

In this embodiment, following three conditions are different from conditions in the sixth embodiment of method, however, other conditions adopted in the sixth embodiment of method are similarly adopted in this embodiment.

The first condition of the three conditions is that as a raw-material solution, gallium bromide and germanium oxide were added in ultrapure water, the raw-material solution was prepared such that the atomic ratio of gallium to germanium was 1:0.01 with gallium that was 0.1 mol/L.

The second condition of the three conditions is that hydrobromic acid was added to an aqueous solution of the raw material solution at a volume percent of 20%.

The third condition of the three conditions is that the film-formation time is set to be 30 minutes.

Accordingly, a crystalline oxide semiconductor film was obtained similarly to the sixth embodiment of method.

A Thirteenth Embodiment of Method

In this embodiment, following one condition is different from the condition in the third embodiment of method, however, other conditions adopted in the third embodiment of method are similarly adopted in this embodiment.

The one condition different from the condition adopted in the third embodiment is that the film-formation time is set to be 720 minutes.

Accordingly, a crystalline oxide semiconductor film was obtained similarly to the third embodiment of method. The thickness of the crystalline oxide semiconductor film that was obtained in this embodiment was 3.8 µm.

A First Comparative Example

In this comparative example, following one condition was different from the condition in the first embodiment of method, however, other conditions adopted in the first embodiment were similarly adopted in this comparative example. Accordingly, a crystalline oxide semiconductor film was obtained similarly to the first embodiment of method.

A Second Comparative Example

In this comparative example, following two conditions are different from conditions in the sixth embodiment of method, however, other conditions adopted in the sixth embodiment of method are similarly adopted in this embodiment.

The first condition of the three conditions is that as a raw-material solution, gallium bromide and germanium oxide were added in ultrapure water, and the raw-material solution was prepared such that the atomic ratio of gallium to germanium was 1:0.05.

The second condition of the three different conditions is that a c-plane sapphire substrate without a buffer layer being laminated on the c-plane sapphire substrate is used, instead of using an a-plane sapphire substrate without a buffer layer being laminated on the a-plane sapphire substrate is.

Accordingly, a crystalline oxide semiconductor film was obtained similarly to the sixth embodiment of method.

A Third Comparative Example

In this comparative example, following two conditions are different from conditions in the sixth embodiment of method, however, other conditions adopted in the sixth embodiment of method are similarly adopted in this embodiment.

The first condition of the two different conditions is a raw-material solution, in that gallium and tin were added such that the atomic ratio of gallium to germanium was 1:0.05.

The second condition of the two conditions is that a c-plane sapphire substrate without a buffer layer being laminated on the c-plane sapphire substrate is used, instead of using an a-plane sapphire substrate without a buffer layer being laminated on the a-plane sapphire substrate is.

Accordingly, a crystalline oxide semiconductor film was obtained similarly to the sixth embodiment of method.

A First Test Example

Crystalline phases of crystalline oxide semiconductor films through the embodiments 1 to 13 of method and the first to third comparative examples were identified by the use of an XRD. The identification was made by 2θ/ω scanning each of the crystalline oxide semiconductor films at angles of 15 degrees to 95 degrees using an XRD instrument with Cu Kα ray source.

As a result of the identifications, crystalline oxide semiconductor films obtained through the first to fifth embodiments and the thirteenth embodiment are m-plane α-$Ga_2O_3$.

Also, as a result of the identifications, crystalline oxide semiconductor films obtained through the embodiments 6 to 12 are a-plane α-$Ga_2O_3$.

Furthermore, as a result of the identifications, crystalline oxide semiconductor films obtained through the first to third comparative examples are c-plane α-$Ga_2O_3$. Tables 1 to 3 show a half value width of an X-ray rocking curve of each of the crystalline oxide semiconductor films obtained by the first, second, fourth, seventh to twelfth embodiments and the first comparative example.

A Second Test Example

A Hall effect of each of the crystalline oxide semiconductor films obtained through the first to thirteenth embodiments and the first to third comparative examples was measured by using the van der pauw method. The carrier concentrations and electron mobilities and electrical resistivity of the crystalline oxide semiconductor films obtained through the first to thirteen embodiments and the first to third comparative examples are shown in Table 1 to Table 3. The Tables 1 to 3 show that crystalline oxide semiconductor films according to embodiments of the present inventive subject matter are noticeable in electrical characteristics, especially in electron mobility.

A Third Test Example

Crystalline oxide semiconductor films obtained through the first to thirteenth embodiments and the first to third comparative examples were observed by an optical-microscopic observation. In the optical-microscopic observation, when the crystalline oxide semiconductor film is free from a crack in a center area that is 3 mm square, "0" in the Tables that means "without crack(s)" is shown. Also, in the optical-microscopic observation, when a crack is shown in a center area that is 3 mm square, "X" that means "with crack(s)" is shown. Tables 1 to 3 show that an occurrence of crack(s) of crystalline oxide semiconductor films according to embodiments of the present inventive subject matter is suppressed.

TABLE 1

| | 1 | 2 | 3 | 4 | 5 | 6 | 7 | 8 |
|---|---|---|---|---|---|---|---|---|
| Carrier concentration ($cm^{-3}$) | 2.89E+19 | 2.84E+19 | 1.31E+19 | 3.13E+19 | 3.13E+19 | 1.95E+19 | 2.91E+19 | 2.01E+19 |
| Electron mobility ($cm^2/Vs$) | 42.70 | 55.83 | 50.22 | 55.35 | 51.77 | 55.82 | 55.61 | 50.73 |
| Electrical resistivity ($m\Omega\ cm$) | 5.06 | 3.94 | 9.50 | 3.61 | 3.86 | 5.74 | 3.86 | 6.13 |
| Half-value width (arcsec) | 688 | 932 | — | 925 | — | — | 814 | 1026 |
| 3 mm square in a center area with/without crack(s) | ◯ without crack(s) | ◯ without crack(s) | ◯ without crack(s) | ◯ without crack(s) | ◯ without crack(s) | ◯ without crack(s) | ◯ without crack(s) | ◯ without crack(s) |

TABLE 2

| | 9 | 10 | 11 | 12 | 13 |
|---|---|---|---|---|---|
| Carrier concentration ($cm^{-3}$) | 1.75E+19 | 1.86E+18 | 2.25E+19 | 1.35E+19 | 1.87E+19 |
| Electron mobility ($cm^2/Vs$) | 48.08 | 45.57 | 31.58 | 35.47 | 93.90 |
| Electrical resistivity ($m\Omega\ cm$) | 7.43 | 73.74 | 8.80 | 13.05 | 3.56 |
| Half-value width (arcsec) | 875 | 814 | 1174 | 392 | — |
| 3 mm square in a center area with/without crack(s) | ◯ without crack(s) | ◯ without crack(s) | ◯ without crack(s) | ◯ without crack(s) | ◯ without crack(s) |

TABLE 3

| | 1st comparative example | 2nd comparative example | 3rd comparative example |
|---|---|---|---|
| Carrier concentration ($cm^{-3}$) | 2.7E+19 | 6.38E+18 | 2.42E+19 |
| Electron mobility ($cm^2/Vs$) | 2.80 | 5.53 | 3.23 |
| Electrical resistivity ($m\Omega\ cm$) | 82.67 | 177.15 | 79.96 |
| Half-value width (arcsec) | 40.00 | — | — |
| 3 mm square in a center area with/without crack(s) | X with crack(s) | X with crack(s) | X with crack(s) |

A Fourteenth Embodiment of Method

In this embodiment, following one condition is different from the conditions in the sixth embodiment of method, however, other conditions adopted in the sixth embodiment of method are similarly adopted in this embodiment.

The one condition different from the conditions adopted in the sixth embodiment is that silicon bromide is used as a dopant. Accordingly, a crystalline oxide semiconductor film obtained in this embodiment was similar in characteristics to the crystalline oxide semiconductor film obtained in the first embodiment of method.

A Fifteenth Embodiment of Method

In this embodiment, a crystalline oxide semiconductor film was obtained similarly to the first embodiment of method. The crystalline oxide semiconductor film obtained in this embodiment has the thickness that is 2.3 μm.

A Sixteenth Embodiment of Method

In this embodiment, following one condition is different from the conditions in the first embodiment of method, however, other conditions adopted in the first embodiment of method are similarly adopted in this embodiment.

The one condition different from the conditions adopted in the first embodiment is that an m-plane of sapphire substrate with an off-angle that is 2° inclined to an a-axis is used as the crystalline substrate. Accordingly, a crystalline oxide semiconductor film obtained in this embodiment was similar in characteristics to the crystalline oxide semiconductor film obtained in the first embodiment of method.

The crystalline oxide semiconductor film obtained in this embodiment has the thickness that is 3.2 μm.

A Seventeenth Embodiment of Method

In this embodiment, a crystalline oxide semiconductor film was obtained similarly to the sixteenth embodiment of method. The crystalline oxide semiconductor film obtained in this embodiment has the thickness that is 2.2 μm.

A Eighteenth Embodiment of Method

In this embodiment, following one condition is different from the conditions in the first embodiment of method, however, other conditions adopted in the first embodiment of method are similarly adopted in this embodiment.

The one condition different from the conditions adopted in the first embodiment is that an m-plane of sapphire substrate with an off-angle that is 2° inclined to an a-axis is used as the crystalline substrate, and the m-plane of sapphire substrate is without a non-doped $\alpha$-$Ga_2O_3$ as a buffer layer being laminated on the m-plane sapphire substrate.

Accordingly, a crystalline oxide semiconductor film was obtained similarly to the first embodiment of method.

The crystalline oxide semiconductor film obtained in this embodiment has the thickness that is 2 μm.

A Nineteenth Embodiment of Method

In this embodiment, following one condition is different from the conditions in the first embodiment of method, however, other conditions adopted in the first embodiment of method are similarly adopted in this embodiment.

The one condition different from the conditions adopted in the first embodiment is that an m-plane of sapphire substrate with an off-angle that is 4° inclined to an a-axis is used as the crystalline substrate is used.

Accordingly, a crystalline oxide semiconductor film was obtained similarly to the first embodiment of method.

The crystalline oxide semiconductor film obtained in this embodiment has the thickness that is 2 μm.

A Twentieth Embodiment of Method

In this embodiment, following one condition is different from the conditions in the eighteenth embodiment of method, however, other conditions adopted in the eighteenth embodiment of method are similarly adopted in this embodiment.

The one condition different from the conditions adopted in the eighteenth embodiment is that when gallium acetylacetonate and tin (II) chloride dihydrate were added in ultrapure water, an aqueous solution was prepared such that the atomic ratio of gallium to tin was 1:0.0002 with gallium that was 0.05 mol/L.

Accordingly, a crystalline oxide semiconductor film was obtained similarly to the eighteenth embodiment of method.

The crystalline oxide semiconductor film obtained in this embodiment has the thickness that is 1.8 μm.

A Twenty-First Embodiment of Method

In this embodiment, following one condition is different from the conditions in the eighteenth embodiment of method, however, other conditions adopted in the eighteenth embodiment of method are similarly adopted in this embodiment.

The one condition different from the conditions adopted in the eighteenth embodiment is that when gallium acetylacetonate and tin (II) chloride dihydrate were added in ultrapure water, an aqueous solution was prepared such that the atomic ratio of gallium to tin was 1:0.0002 with gallium that was 0.05 mol/L.

Accordingly, a crystalline oxide semiconductor film was obtained similarly to the eighteenth embodiment of method.

The crystalline oxide semiconductor film obtained in this embodiment has the thickness that is 1.8 μm.

A Fourth Test Example

Crystalline phases of crystalline oxide semiconductor films obtained through the embodiments fifteenth to twenty-first of method were identified as m-plane $\alpha$-$Ga_2O_3$.

Furthermore, just for reference, Table 12 shows a result of crystalline oxide semiconductor films of the embodiments twentieth and twenty-first measured by the XRD. Also, crystalline oxide semiconductor films obtained through the fifteenth to twenty-first embodiments were evaluated similarly to the first to third tests.

The carrier concentration and electron mobility and half value width of an X-ray rocking curve of each of the crystalline oxide semiconductor films obtained through the fifteenth to twenty-first embodiments are evaluated and shown in Table 4.

TABLE 4

| | 15 | 16 | 17 | 18 | 19 | 20 | 21 |
|---|---|---|---|---|---|---|---|
| Carrier concentration ($cm^{-3}$) | 1.84E+19 | 1.87E+19 | 1.76E+19 | 1.60E+19 | 2.11E+19 | 1.75E+18 | 1.76E+18 |
| Electron mobility ($cm^2$/Vs) | 86.43 | 93.91 | 106.90 | 112.58 | 30.17 | 40.03 | 47.57 |
| Electrical resistivity (arcsec) | 1004.4 | 878.4 | 993.6 | 1731.6 | 997.2 | 1569.6 | 1011.6 |
| 3 mm square in a center area with/without crack(s) | ○ without crack(s) | ○ without crack(s) | ○ without crack(s) | ○ without crack(s) | ○ without crack(s) | ○ without crack(s) | ○ without crack(s) |

A Fifth Test Example

A Hall effect of Sn-doped $\alpha$-$Ga_2O_3$ film on an m-plane sapphire substrate of a crystalline oxide semiconductor film obtained through the first embodiment of method except for following three conditions was measured by using the van der pauw method. The electron mobilities and the carrier concentrations of the crystalline oxide semiconductor film were evaluated.

The three conditions are different from the conditions in the first embodiment of method, however, other conditions adopted in the first embodiment of method are similarly adopted in this embodiment.

A first condition of the three conditions is that mixing gallium acetylacetonate, and tin (II) chloride dihydrate to be dissolved while adding a small amount of hydrochloric acid, to obtain a solution that was used as a raw-material solution. A second condition of the three conditions is that an m-plane sapphire substrate was used as a crystalline substrate. A third condition of the three conditions is that the temperature during the film-formation process was 500° C.

Accordingly, a crystalline oxide semiconductor film that is an $\alpha$-$Ga_2O_3$ film was obtained similarly to the first embodiment of method.

Figure 13:
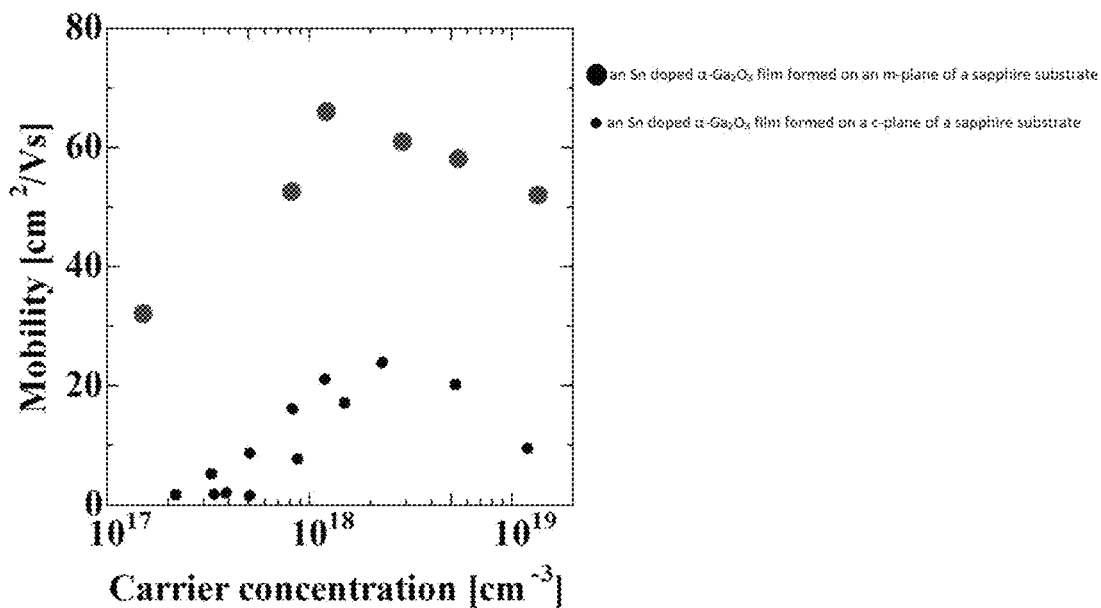
FIG. 13 shows a result of a Hall effect measurement of a test embodiment. The vertical axis shows an electron mobility ($cm^2/Vs$), and the horizontal axis shows a carrier concentration ($/cm^3$).

Also, two or more $\alpha$-$Ga_2O_3$ films were obtained from two or more raw-material solutions such that a carrier concentration was closer to $1.0 \times 10^{18}$/$cm^3$ by changing the blending ratio of gallium acetylacetonate and tin (II) chloride dihydrate and used for this evaluation. FIG. 13 shows a result of a Hall effect measurement of the fifth test embodiment. For comparative tests, results of measurement of crystalline oxide semiconductor films that are $\alpha$-$Ga_2O_3$ films obtained by using c-plane sapphire substrate instead for using m-plane sapphire substrate are also shown in FIG. 13.

FIG. 13 clearly shows that an α-Ga$_2$O$_3$ film obtained by forming the α-Ga$_2$O$_3$ film on an m-plane sapphire substrate is superior in electric characteristics than an α-Ga$_2$O$_3$ film obtained by forming the α-Ga$_2$O$_3$ film on a c-plane sapphire substrate.

Figure 14:
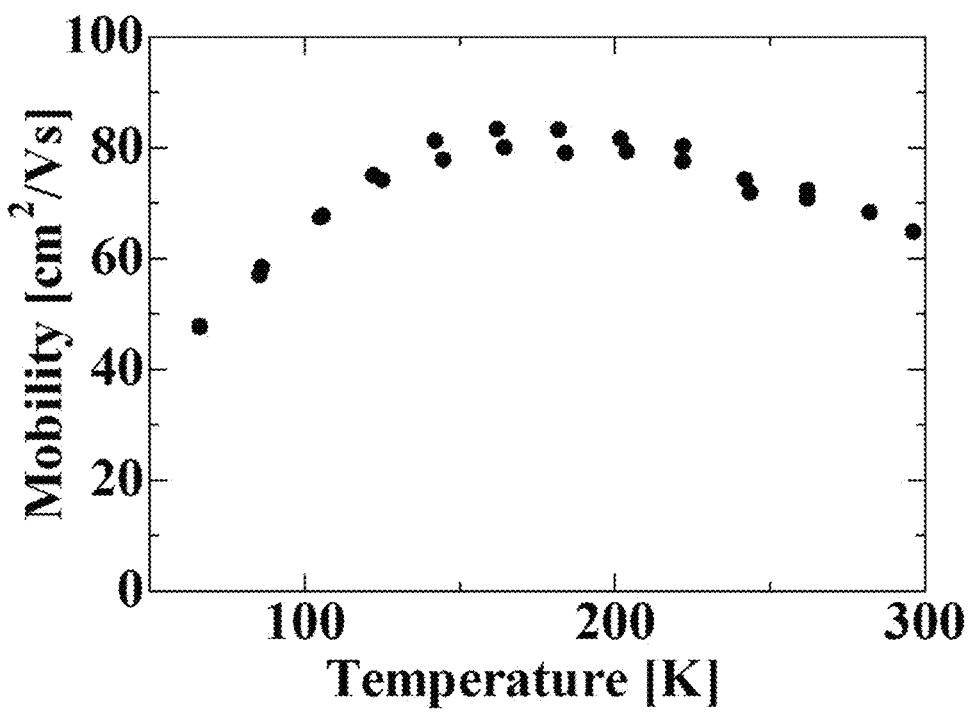
FIG. 14 shows a result of a variable temperature Hall effect measurement of a test embodiment. The vertical axis shows an electron mobility ($cm^2/Vs$), and the horizontal axis shows temperature (K).

Also, FIG. 14 shows a result of a variable temperature Hall effect measurement of a crystalline oxide semiconductor film that is a α-Ga$_2$O$_3$ film with a carrier concentration that is $1.1 \times 10^-/cm^3$, and the crystalline oxide semiconductor film was obtained by the first test example. The result shows temperature characteristics of electron mobility. FIG. 14 clearly shows that the crystalline oxide semiconductor film maintains electron mobility that is 40 cm$^2$/Vs or more in a low temperature zone. Also, FIG. 14 shows that the crystalline oxide semiconductor film is sufficient in electric characteristics even in a high temperature zone.

According to an embodiment of a present inventive subject matter, a crystalline oxide semiconductor film may be used in a semiconductor device. The semiconductor device may be a compound semiconductor device. The semiconductor device may be an electronic part. The semiconductor device may be used in an optical device. The semiconductor device may be used in an electronic appliance and/or system. A crystalline oxide semiconductor film according to an embodiment of a present inventive subject matter is expected to be used in various devices, appliances, and/or systems.

REFERENCE NUMBER DESCRIPTION 19 a CVD (Chemical Vapor Deposition) apparatus
20 a crystalline substrate
21 a susceptor
22a a carrier gas supply device
22b a diluted carrier gas supply device
23a a first flow-control valve
23b a second flow-control valve
24 a mist source
24a a raw material solution
25 a container
25a water
26 an ultrasonic transducer
27 a supply pipe
28 a heater
29 an air duct
101a an n$^-$-type semiconductor layer
101b an n$^+$-type semiconductor layer
105a a Schottky electrode
105b an Ohmic electrode
121a an n-type semiconductor layer with a wide bandgap
121b a n-type semiconductor layer with a narrow bandgap
121c an n$^+$-type semiconductor layer
124 a semi-insulating layer
125a a gate electrode
125b a source electrode
125c a drain electrode
128 a buffer layer
131a an n-type semiconductor layer
131b a first n$^+$-type semiconductor layer
131c a second n$^+$-type semiconductor layer
134 a gate insulating film
135a a gate electrode
135b a source electrode
135c a drain electrode
141a an n-type semiconductor layer
141b a first n+ type semiconductor layer
141c a second n+ type semiconductor layer
145a a gate electrode
145b a source electrode
145c a drain electrode
151 an n-type semiconductor layer
151a an n$^-$-type semiconductor layer
151b an n$^+$-type semiconductor layer
152 a ptype semiconductor layer
154 a gate insulating film
155a a gate electrode
155b an emitter electrode
155c a collector electrode
161 an n-type semiconductor layer
162 a p-type semiconductor layer
163 a light-emitting layer
165a a first electrode
165b a second electrode
167 a light-transmitting electrode
169 a substrate

What is claimed is:

1. A crystalline oxide semiconductor film, comprising:
   a layer including α-Ga$_2$O$_3$ as a major component and a dopant,
   wherein the layer has an electron mobility that is 30 cm$^2$/Vs or more.

2. The crystalline oxide semiconductor film according to claim 1,
   wherein the layer has a carrier concentration that is $1.0 \times 10^{18}/cm^3$ or more.

3. The crystalline oxide semiconductor film according to claim 1,
   wherein the layer has an electrical resistivity that is 50 mΩ cm or less.

4. The crystalline oxide semiconductor film according to claim 1,
   wherein the layer has an electrical resistivity that is 5 mΩ cm or less.

5. The crystalline oxide semiconductor film according to claim 1,
   wherein the layer has a principal plane that is an a-plane or an m-plane.

6. The crystalline oxide semiconductor film according to claim 1,
   wherein the dopant is at least one selected from among tin, germanium, and silicon.

7. The crystalline oxide semiconductor film according to claim 1,
   wherein the dopant is tin.

8. The crystalline oxide semiconductor film according to claim 1,
   wherein the layer further includes indium and/or aluminum.

9. A crystalline oxide semiconductor device, comprising:
   the crystalline oxide semiconductor film according to claim 1;
   a first electrode arranged on a first side of the crystalline oxide semiconductor film; and
   a second electrode arranged on the first side of the crystalline oxide semiconductor film.

10. A crystalline oxide semiconductor system, comprising:
    a motherboard comprising electrodes and/or wiring patterns; and
    the crystalline oxide semiconductor device according to claim 9 electrically connected to the electrodes and/or the wiring patterns.

11. A crystalline oxide semiconductor film, comprising:
a layer including α-$Ga_2O_3$ as a major component and a dopant,
wherein the layer has a carrier concentration that is $1.0\times10^{18}$/cm$^3$ or more, a principal plane that is an a-plane or an m-plane, and an electron mobility that is 30 cm$^2$/Vs or more.

12. The crystalline oxide semiconductor film according to claim 11,
wherein the layer has an electrical resistivity that is 50 mΩ cm or less.

13. A crystalline oxide semiconductor device, comprising:
the crystalline oxide semiconductor film according to claim 11;
a first electrode arranged on a side of the crystalline oxide semiconductor film; and
a second electrode arranged on the side of the crystalline oxide semiconductor film.

14. A crystalline oxide semiconductor device, comprising:
the crystalline oxide semiconductor film according to claim 11;
a first electrode arranged on a first side of the crystalline oxide semiconductor film; and
a second electrode arranged on a second side of the crystalline oxide semiconductor film,
wherein the crystalline oxide semiconductor device is a Schottky barrier diode.

15. A crystalline oxide semiconductor film, comprising:
a layer including α-$Ga_2O_3$ as a major component and a dopant,
wherein the dopant is an n-type dopant, and
wherein the layer has a principal plane that is an a-plane or an m-plane, and an electron mobility that is 30 cm$^2$/Vs or more.

16. The crystalline oxide semiconductor film according to claim 15,
wherein the layer has an electrical resistivity that is 50 mΩ cm or less.

17. A crystalline oxide semiconductor device, comprising:
the crystalline oxide semiconductor film according to claim 15; and
an electrode arranged on a side of the crystalline oxide semiconductor film.

18. The crystalline oxide semiconductor film according to claim 11,
wherein the dopant comprises at least one selected from among tin, germanium, silicon, titanium, zirconium, vanadium, and niobium.

19. The crystalline oxide semiconductor film according to claim 18,
wherein the electron mobility is 50 cm$^2$/Vs or more.

20. The crystalline oxide semiconductor film according to claim 15,
wherein the dopant comprises at least one selected from among tin, germanium, silicon, titanium, zirconium, vanadium, and niobium.

* * * * *